United States Patent
Zeng et al.

(10) Patent No.: US 12,159,855 B2
(45) Date of Patent: Dec. 3, 2024

(54) SILICON CARBIDE COMPOSITE WAFER AND MANUFACTURING METHOD THEREOF

(71) Applicant: Hong Chuang Applied Technology Co., Ltd, Zhubei (TW)

(72) Inventors: Yan-Kai Zeng, Zhubei (TW); Bai-Xuan Jiang, Zhubei (TW)

(73) Assignee: HONG CHUANG APPLIED TECHNOLOGY CO., LTD., Zhubei (TW)

( * ) Notice: Subject to any disclaimer, the term of this patent is extended or adjusted under 35 U.S.C. 154(b) by 593 days.

(21) Appl. No.: 17/499,226

(22) Filed: Oct. 12, 2021

(65) Prior Publication Data

US 2022/0384385 A1    Dec. 1, 2022

(30) Foreign Application Priority Data

May 25, 2021 (TW) .................. 110118804

(51) Int. Cl.
  *B32B 7/04*     (2019.01)
  *B32B 17/06*    (2006.01)
  *B32B 18/00*    (2006.01)
  *C30B 29/36*    (2006.01)
  *C30B 33/06*    (2006.01)
  *H01L 21/02*    (2006.01)
  (Continued)

(52) U.S. Cl.
  CPC .............. *H01L 24/80* (2013.01); *C30B 29/36* (2013.01); *C30B 33/06* (2013.01); *H01L 21/02002* (2013.01); *H01L 21/76251* (2013.01); *H01L 24/08* (2013.01); *H01L 2224/08225* (2013.01); *H01L 2224/80009* (2013.01); *H01L 2224/80236* (2013.01); *H01L 2224/80487* (2013.01); *H01L 2224/80488* (2013.01); *H01L 2224/80894* (2013.01); *H01L 2924/10272* (2013.01)

(58) Field of Classification Search
  None
  See application file for complete search history.

(56) References Cited

U.S. PATENT DOCUMENTS

| | | | |
|---|---|---|---|
| 9,741,685 B2 | 8/2017 | Chen et al. | |
| 2015/0060869 A1 | 3/2015 | Ro et al. | |
| 2020/0357637 A1* | 11/2020 | Rupp | H01L 21/02098 |

FOREIGN PATENT DOCUMENTS

| | | |
|---|---|---|
| CN | 103021814 A | 4/2013 |
| CN | 111383915 A | 7/2020 |

(Continued)

*Primary Examiner* — Michael J Feely
(74) *Attorney, Agent, or Firm* — MUNCY, GEISSLER, OLDS & LOWE, P.C.

(57) ABSTRACT

The present invention provides a silicon carbide composite wafer and a manufacturing method thereof. The silicon carbide composite wafer includes (a) a silicon carbide material and (b) a wafer substrate, and the upper surface of the wafer substrate is bonded to the lower surface of the silicon carbide material, wherein the lower surface of the silicon carbide material and/or the upper surface of the wafer substrate undergo a surface modification, thereby allowing the silicon carbide material to be bonded to the wafer substrate directly and firmly. The technical effects of the present invention include achieving strong bonding between the wafer and the substrate, reducing manufacturing process, increasing yield rate, and achieving high industrial applicability.

7 Claims, 1 Drawing Sheet

(51) Int. Cl.
*H01L 21/762* (2006.01)
*H01L 23/00* (2006.01)

(56) References Cited

FOREIGN PATENT DOCUMENTS

| | | |
|---|---:|---:|
| EP | 2 907 790 A1 | 8/2015 |
| JP | 2000-178740 A | 6/2000 |
| JP | 2013-062339 A | 4/2013 |
| JP | 2017-114694 A | 6/2017 |
| JP | 2019-193242 A | 10/2019 |
| JP | 2019-195036 A | 11/2019 |
| TW | 2013-42494 A | 10/2013 |
| TW | 2016-27150 A | 8/2016 |

\* cited by examiner

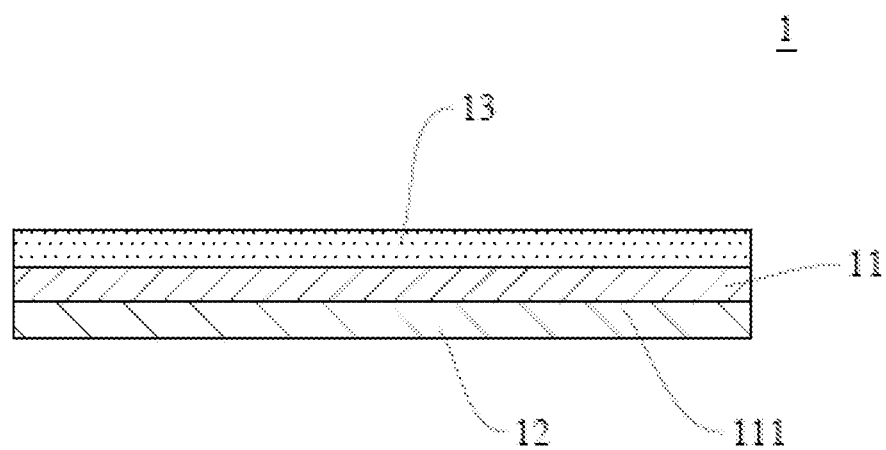

SILICON CARBIDE COMPOSITE WAFER AND MANUFACTURING METHOD THEREOF

BACKGROUND OF THE INVENTION

1. Technical Field

The present invention relates to a silicon carbide composite wafer and a manufacturing method thereof that are applicable to semiconductor manufacturing processes.

2. Description of Related Technology

In view of the high frequency development trend in the telecommunication sector, the performance of relevant telecommunication elements is required to be improved significantly to satisfy the market demands. Accordingly, there is a need to provide thin wafers or composite wafers efficiently and cost-effectively. For a known composite wafer, the chemical vapor deposition method is used to form a crystal film on a wafer substrate, followed by the growing of GaN layer thereon. Alternatively, the hydride vapor phase epitaxy (HVPE) method can be used to form a crystal layer on the wafer substrate. Nevertheless, for a composite wafer, there are still further demands for improvement in terms of both the material and manufacturing process.

BRIEF SUMMARY OF THE INVENTION

In a known composite wafer manufacturing process, it is necessary to form a thin film at the bonding area between the substrate and the upper material in order to allow these two different materials to be bonded firmly; however, such process is complicated and time consuming. Accordingly, to overcome the aforementioned drawbacks, the inventor seeks to improve the manufacturing process of the composite wafer.

An aspect of the present invention is to provide a silicon carbide composite wafer; comprising: (a) a silicon carbide material; and (b) a wafer substrate having an upper surface bonded to a lower surface of the silicon carbide material, wherein the lower surface of the silicon carbide material and/or the upper surface of the wafer substrate undergo a surface modification, thereby allowing the silicon carbide material to be directly bonded to the wafer substrate.

In some embodiments, the silicon carbide composite wafer is ceramic or glass.

In some embodiments, the ceramic is selected from a group consisting of aluminum nitride, aluminum oxide, silicon carbide and silicon nitride.

In some embodiments, the wafer substrate of the silicon carbide composite wafer is monocrystalline material or polycrystalline material.

In some embodiments, the thickness of the silicon carbide material of the silicon carbide composite wafer is 0.2~500 μm.

In some embodiments, the surface of the silicon carbide material of the silicon carbide composite wafer further comprises a crystallizing layer.

In some embodiments, the surface modification of the silicon carbide composite wafer refers to generating a physical bonding at a surface; in a preferred embodiment, the physical bonding is Van de Waals force, Coulomb force, and frictional force.

Another aspect of the present invention is to provide a manufacturing method for a silicon carbide composite, comprising the following steps: (a) forming a silicon carbide material through a crystal growth treatment of a silicon carbide; and (b) providing a wafer substrate, and performing a surface modification on a lower surface of the silicon carbide material and/or an upper surface of the wafer substrate to generate a hydrogen bonding, an electrostatic bonding or a physical bonding, followed by forming a silicon carbide composite wafer via direct bonding.

In some embodiments, the surface modification of the manufacturing method for a silicon carbide composite refers to generating the hydrogen bonding on the lower surface of the silicon carbide material and/or an upper surface of the wafer substrate through a hydrogen treatment.

In some embodiments, the silicon carbide material and the wafer substrate of the manufacturing method for a silicon carbide composite are electrostatically bonded to each other.

In comparison to a known technology, a silicon carbide composite wafer of the present invention comprises a substrate made of ceramic or glass material, such that it has the characteristics of high dielectric constant, great insulativity, high thermal conductivity, heat resistance and excellent heat dissipation, and in particular, it also exhibits great stability under high humidity environment. Furthermore, since the manufacturing process of the present invention is able to achieve direct bonding between the silicon carbide material and the wafer substrate, the bonding achieved therebetween is excellent, and it requires no formation of a thin film that is necessary for the prior technology to achieve the firm bonding between two different materials. Accordingly, the manufacturing process of the present invention is simple, effective and convenient.

BRIEF DESCRIPTION OF THE SEVERAL VIEWS OF THE DRAWINGS

The sole FIGURE is a schematic view showing the structure of the silicon carbide composite wafer of the present invention

DETAILED DESCRIPTION OF THE INVENTION

The following provides a detailed description on the embodiments of the present invention; however, such description and the embodiments provided shall not be used to limit the scope of the present invention. Any modification and change made by a person with ordinary skills in the technical field of the present invention based on the embodiments disclosed by the present invention and within the principle and scope of the present invention shall be treated to be within the scope of the present invention.

The term "comprising, having or including" described in the following content shall mean the existence of one or more than one parts, steps, operations and/or elements or the inclusion of such parts, steps, operations and/or elements. The term "approximately or about" or "basically" described in the following content shall mean that a certain value or range is close to an acceptable specified tolerance, and the purpose of the use of such term is to prevent a third party's unreasonable, illegal or unfair interpretation of a value or range disclosed by the present invention to be within or equivalent to the exact or absolute value or range disclosed by the present invention only. The term "one" or "a" described in the following content shall mean one or more than one, i.e., at least one.

The present invention provides a silicon carbide composite wafer, comprising: (a) a silicon carbide material; (b) a wafer substrate having an upper surface bonded to a lower surface of the silicon carbide material; and wherein the lower surface of the silicon carbide material and/or the upper surface of the water substrate undergo a surface modification, thereby allowing the silicon carbide material to be directly bonded to the wafer substrate.

The present invention further provides a manufacturing method for a silicon carbide composite, comprising the following steps: (a) forming a silicon carbide material through a crystal growth treatment of a silicon carbide; and (b) providing a wafer substrate, and performing a surface modification on a lower surface of the silicon carbide material and/or an upper surface of the wafer substrate to generate a hydrogen bonding, an electrostatic bonding or a physical bonding, followed by forming a silicon carbide composite wafer via direct bonding.

Please refer to the FIGURE, showing a schematic view of a structure of the silicon carbide composite wafer of the present invention. The silicon carbide composite wafer 1 is formed via direct bonding between the wafer substrate 12 and the silicon carbide material 11. In other words, an additional thin film structure does not exist between the wafer substrate 12 and the silicon carbide material 11, and the two materials are bonded to each other directly via the contact surface 111 only. Furthermore, the top of the silicon carbide material 11 can further comprise a crystallizing layer 13 depending upon the needs.

For the aforementioned wafer substrate 12, in a preferred embodiment, it can be made by ceramic or glass material. The "ceramic" refers to an inorganic non-metal solid material formed via the man-made high-temperature treatment process from a metal or non-metal compound, including silicate, oxide, carbide, nitride, sulfide, and boride, etc.; and preferably, including but not limited to a group consisting of aluminum nitride, aluminum oxide, silicon carbide and silicon nitride. For example, for the substrate, the ceramic is selected from aluminum nitride, aluminum oxide, silicon carbide and silicon nitride; for the substrate, the ceramic is selected from aluminum nitride, aluminum oxide and silicon carbide; for the substrate, the ceramic is selected from aluminum oxide, silicon carbide and silicon nitride; for the substrate, the ceramic is selected from aluminum nitride, silicon carbide and silicon nitride; for the substrate, the ceramic is selected from aluminum nitride and aluminum oxide; for the substrate, the ceramic is selected from aluminium nitride and silicon carbide; for the substrate, the ceramic is selected from aluminum nitride and silicon nitride; for the substrate, the ceramic is selected from aluminum oxide and silicon carbide; for the substrate, the ceramic is selected from aluminum oxide and silicon nitride; for the substrate, the ceramic is selected from aluminum nitride; for the substrate, the ceramic is selected from aluminum oxide; for the substrate, the ceramic is selected from silicon carbide; tier the substrate, the ceramic is selected from silicon nitride.

The term "monocrystalline material or polycrystalline material" refers to a single-crystal or poly-crystal material. The difference between the two relies in that when a molten single crystal material is cured, the atoms are arranged to form multiple crystal nucleuses in diamond lattice. If the crystal nucleus grows into grains of the same crystal plane orientation, then a monocrystalline material is formed. On the other hand, if the crystal nucleus forms grains of different crystal plane orientations, then a polycrystalline material is formed. The difference between the monocrystalline and polycrystalline materials mainly relies in their physical property. For example, in terms of the mechanical property and electrical property, the polycrystalline material is of properties weaker than those of the monocrystalline material. In a preferred embodiment, the wafer substrate is a monocrystalline material or a polycrystalline material.

For the "thickness of the silicon carbide material" of the present invention described herein, in a preferred embodiment, the thickness can be between 0.2 μm~500 μm, such as between 0.4 μm~500 μm, between 0.6 μm~500 μm, between 0.8 μm~500 μm, between 1.0 μm~500 μm, between 2.0 μm~500 μm, between 4.0 μm~500 μm, between 6.0 μm~500 μm, between 8.0 μm~500 μm, between 10 μm~500 μm, between 12 μm~500 μm, between 14 μm~500 μm, between 16 μm~500 μm, between 0.2 μm~500 μm, between 0.2 μm~180 μm, between 0.2 μm~160 μm, between 0.2 μm~140 μm, between 0.2 μm~120 μm, between 0.2 μm~100 μm, between 0.2 μm~80 μm, between 0.2 μm~60 μm, between 0.2 μm~40 μm, between 0.2 μm~20 μm, between 0.2 μm~1 μm, between 0.2 m~0.8 μm, between 0.2 μm~0.6 μm, between 0.2 μm~0.4 μm. The thickness of such silicon carbide material can be adjusted depending upon the needs. For example, when the silicon carbide material 11 is bonded to the surface of the wafer substrate 12, the method of laser cutting or grinding can be adopted to reduce the thickness of the silicon carbide material 11.

The "crystallizing layer" of the present invention described herein refers to the main substrate material of the emissive layer formed by the monocrystalline material, such as monocrystalline gallium arsenide (GaAs) substrate, gallium phosphide (GaP) substrate, indium phosphide (InP) substrate, sapphire ($Al_2O_3$) substrate, silicon carbide (SiC) substrate, and gallium nitride (GaN) substrate, etc.

The aforementioned crystallizing layer adopts the epitaxy growth method. The "epitaxy" refers to the extension of thin film growing on the monocrystalline substrate, such that a continuum of a monocrystal structure is formed on the monocrystalline substrate with the addition of atoms, such as liquid phase epitaxy (LPE), vapor phase epitaxy (VPE) and molecular beam epitaxy (MBE), etc.; wherein the VPE includes physical vapor deposition (PVD) and chemical vapor deposition (CVD).

The "surface modification" of the present invention described herein refers to the bonding surface between the silicon carbide material and the wafer, meaning that the either both or one of the lower surface of the silicon carbide material and the upper surface of the wafer substrate undergo a chemical or physical treatment, such that the surface is able to generate hydrogen bonding or charged ion or physical bonding, including but not limited to Van de Waals force, Coulomb force or frictional force, etc.

The method of generating hydrogen bonding includes but not limited to immersion into a liquid containing hydrogen atoms in order to modify the surface and to generate hydrogen bonding force. The liquid containing hydrogen atoms can be chromic acid, sulfuric acid, hydrochloric acid, nitric acid, sulfurous acid, hydrofluoric acid, perchloric acid, hydrobromic acid, perbromic acid, fluorosilicic acid, chlorolead metaphosphoric acid, osmic acid, permanganic acid, selenic acid, ferric acid fluoroboric acid, fluorosulfonic acid, cyanic acid, thiocyanic acid, metaperiodic acid, 2,4,6-trinitrophenol, 2,4,6-trinitrobenzoic acid, trifluoroacetic acid, trichloroacetic acid, methanesulfonic acid, benzenesulfenic acid, cyclohexyl mercaptan sulfonic acid, or 2-chloroethane mercaptan, etc.

The method of generating electrostatic attraction includes but not limited to strike the contact surface with plasma in order to generate positive and negative charges, thereby achieving attraction through the use of such charges.

Regarding the type of physical bonding generated, such as Van de Waals force, Coulomb force, and frictional force, etc., for the Van de Waals force, due to the extremely flat surface, there is still potential difference for either different or same materials, such that the charge attraction generated through the use of the potential difference refers to the Van de Waals force. The Coulomb force refers to the potential difference generated from the provision of surface charges (such as, provision through the use of plasma). The frictional force between solid surfaces comes from the attractive force among the atoms and molecules at the solid surfaces as well as the locking resistance caused by the surface roughness.

The aforementioned "plasma" refers to the fourth main state of matter other than solid state, liquid state and vapor state, which is also called plasma body. When a gas is under high temperature or electromagnetic field, it can become plasma, and plasma is an ionized gas carrying an equivalent amount of positive and negative charges, which is formed by ions, electrons and neutral atoms and molecules. External energy is applied to allow the electrons in the gas to gain energy and to accelerate in order to collide with neutral atoms without charges. Since the neutral atoms without charge are able to generate ions and accelerated electrons with charge after the collision with the accelerated electrons, these freed electrons are further accelerated under the electromagnetic field and also collide with other neutral atoms. Consequently, through such repetitive cycle, the gas is able to generate the gas breakdown effect, thereby achieving the plasma state. The present invention utilizes the plasma generated to collide with the process gas in the chamber in order to ionize the gas, and the ionized gas is attracted to the wafer in order to undergo the surface modification, thereby generating electrostatic charge on the surface.

In view of the above, the silicon carbide composite wafer of the present invention has the following merits:

1. It has the characteristics of high dielectric constant, insulativity, high thermal conductivity, heat resistance and great heat dissipation, and in particular, has the stable performance under high humidity.

2. The manufacturing method for a silicon carbide composite wafer of the present invention is to bond the silicon carbide material and the wafer substrate together directly, and either both surfaces of the two materials or one of the surfaces of the two materials undergo the surface modification, such that the bonding achieved is relatively stronger, thereby reducing the complexity of the manufacturing process.

3. With the characteristic of the strong bonding achieved through the material of the silicon carbide composite wafer of the present invention, grinding process cats be performed on the wafer according to the needs in order to reduce its thickness, thereby increasing its subsequent industrial applicability.

The above is the detailed description of the present invention. However, the above is merely the preferred embodiment of the present invention and cannot be the limitation to the implement scope of the invention, which means the variation and modification according to the present invention may still fall into the scope of the present invention.

What is claimed is:

1. A silicon carbide composite wafer, comprising:
   (a) a silicon carbide material; and
   (b) a wafer substrate having an upper surface bonded to a lower surface of the silicon carbide material,
   wherein the lower surface of the silicon carbide material and/or the upper surface of the wafer substrate undergo a surface modification generating a physical bonding of Van der Waals force, Coulomb force or frictional force, thereby allowing the silicon carbide material to be directly bonded to the wafer substrate.

2. The silicon carbide composite wafer according to claim 1, wherein the wafer substrate is ceramic or glass.

3. The silicon carbide composite wafer according to claim 2, wherein the ceramic is selected from a group consisting of aluminum nitride, aluminum oxide, silicon carbide and silicon nitride.

4. The silicon carbide composite wafer according to claim 1, wherein the wafer substrate is a monocrystalline material or a polycrystalline material.

5. The silicon carbide composite wafer according to claim 1, wherein a thickness of the silicon carbide material is 0.2-500 μm.

6. The silicon carbide composite wafer according to claim 5, wherein a surface of the silicon carbide material further comprises a crystallizing layer.

7. A manufacturing method for a silicon carbide composite, comprising the following steps:
   (a) forming a silicon carbide material through a crystal growth treatment of a silicon carbide; and
   (b) providing a wafer substrate, and performing a surface modification on a lower surface of the silicon carbide material and/or an upper surface of the wafer substrate to generate a physical bonding, and then bonded by Van der Waals force, Coulomb force or frictional force, followed by forming a silicon carbide composite wafer via direct bonding.

* * * * *